United States Patent
Tang et al.

(10) Patent No.: US 10,998,530 B2
(45) Date of Patent: May 4, 2021

(54) DISPLAY PANEL

(71) Applicants: Chengdu BOE Optoelectronics Technology Co., Ltd., Chengdu (CN); BOE Technology Group Co., Ltd., Beijing (CN)

(72) Inventors: Guoqiang Tang, Beijing (CN); Yingsong Xu, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 217 days.

(21) Appl. No.: 16/466,879

(22) PCT Filed: Oct. 30, 2018

(86) PCT No.: PCT/CN2018/112639
§ 371 (c)(1),
(2) Date: Jun. 5, 2019

(87) PCT Pub. No.: WO2019/137072
PCT Pub. Date: Jul. 18, 2019

(65) Prior Publication Data
US 2020/0274107 A1      Aug. 27, 2020

(30) Foreign Application Priority Data
Jan. 15, 2018   (CN) .......................... 201810036170.3

(51) Int. Cl.
*H01L 51/52*     (2006.01)
*H01L 27/32*     (2006.01)
*H01L 51/56*     (2006.01)

(52) U.S. Cl.
CPC ...... *H01L 51/5296* (2013.01); *H01L 27/3262* (2013.01); *H01L 51/5203* (2013.01); *H01L 51/56* (2013.01); *H01L 2227/323* (2013.01)

(58) Field of Classification Search
CPC ............. H01L 51/5296; H01L 27/3262; H01L 51/5203
See application file for complete search history.

(56) References Cited

U.S. PATENT DOCUMENTS 9,373,642 B2   6/2016  Mao et al.
9,881,985 B2   1/2018  Li et al.
(Continued)

FOREIGN PATENT DOCUMENTS

CN   102651455 A   8/2012
CN   103730587 A   4/2014
(Continued)

OTHER PUBLICATIONS

First Office Action, including Search Report, for Chinese Patent Application No. 201810036170.3, dated Nov. 11, 2019, 9 pages.
(Continued)

*Primary Examiner* — Anthony Ho
(74) *Attorney, Agent, or Firm* — Westman, Champlin & Koehler, P.A.

(57) ABSTRACT

A display panel is disclosed. The display panel includes: a base substrate; a gate electrode on the base substrate; an active layer spaced apart from the gate electrode by a gate insulating layer; a light emitting layer disposed on a side of the active layer away from the gate electrode; and a source electrode and a drain electrode, configured in such a way that a current is allowed to flow through the light emitting layer via the active layer, wherein an energy level transition layer is provided between the active layer and the light emitting layer.

20 Claims, 9 Drawing Sheets

(56) References Cited

U.S. PATENT DOCUMENTS

| | | |
|---|---|---|
| 10,082,714 B2 | 9/2018 | Yao |
| 10,319,290 B2 | 6/2019 | Zhang et al. |
| 2014/0175385 A1 | 6/2014 | Li et al. |
| 2017/0193897 A1 | 7/2017 | Zhang et al. |

FOREIGN PATENT DOCUMENTS

| | | |
|---|---|---|
| CN | 103956433 A | 7/2014 |
| CN | 104091830 A | 10/2014 |
| CN | 104393180 A | 3/2015 |
| CN | 104617154 A | 5/2015 |
| CN | 105140410 A | 12/2015 |
| CN | 105575910 A | 5/2016 |
| JP | H05110135 A | 4/1993 |

OTHER PUBLICATIONS

Second Office Action, including Search Report, for Chinese Patent Application No. 201810036170.3, dated Apr. 26, 2020, 12 pages.

DISPLAY PANEL

CROSS-REFERENCE TO RELATED APPLICATION

This application is a Section 371 National Stage Application of International Application No. PCT/CN2018/112639, filed on Oct. 30, 2018, entitled "DISPLAY PANEL", which claims priority to Chinese Patent Application No. 201810036170.3 filed on Jan. 15, 2018 with CNIPA, incorporated herein by reference in entirety.

TECHNICAL FIELD

Embodiments of the present disclosure relate to the field of display technology, and in particular, to a display panel.

BACKGROUND

A pixel structure in the current OLED display panel includes an OLED light emitting layer and a driving thin film transistor (DTFT). However, such a display panel still needs to be improved.

SUMMARY

According to an aspect of the present disclosure, there is provided a display panel, comprising:
a base substrate;
a gate electrode on the base substrate;
an active layer spaced apart from the gate electrode by a gate insulating layer;
a light emitting layer disposed on a side of the active layer away from the gate electrode; and
a source electrode and a drain electrode, configured in such a way that a current is allowed to flow through the light emitting layer via the active layer,
wherein an energy level transition layer is provided between the active layer and the light emitting layer.

In some embodiments of the present disclosure, the active layer is made of an inorganic semiconductor material.

In some embodiments of the present disclosure, the inorganic semiconductor material comprises at least one of polysilicon, monocrystalline silicon, or metal oxide semiconductor.

In some embodiments of the present disclosure, orthographic projections of the source electrode and the drain electrode on the active layer are two concentric non-enclosed rings spaced apart from each other.

In some embodiments of the present disclosure, the source electrode and the active layer are electrically connected to each other, and the drain electrode and the light emitting layer are electrically connected to each other.

In some embodiments of the present disclosure, the source electrode and the light emitting layer are electrically connected to each other, and the drain electrode and the light emitting layer are electrically connected to each other.

In some embodiments of the present disclosure, the display panel further comprises a connection electrode, wherein the light emitting layer and the drain electrode are electrically connected to each other via the connection electrode.

In some embodiments of the present disclosure, an orthographic projection of the connection electrode on the active layer partially overlaps with an orthographic projection of the light emitting layer on the active layer.

In some embodiments of the present disclosure, at least one of the drain electrode or the connection electrode is a transparent electrode.

In some embodiments of the present disclosure, the active layer is a p-type active layer, and a highest occupied molecular orbital of the energy level transition layer is in an energy level match with a work function of the p-type active layer.

In some embodiments of the present disclosure, the active layer is an n-type active layer, and a lowest unoccupied molecular orbital of the energy level transition layer is in an energy level match with a work function of the n-type active layer.

In some embodiments of the present disclosure, the gate electrode, the active layer, the gate insulating layer, the light emitting layer, the source electrode and the drain electrode constitute an luminous field effect transistor, the display panel comprises a plurality of the luminous field effect transistors, the plurality of luminous field effect transistors are arranged in such a way that source electrodes of two adjacent luminous field effect transistors in a first direction are integrated to form a first combined body and drain electrodes of two adjacent luminous field effect transistors in the first direction are integrated to form a second combined body, wherein the first combined body and the second combined body are alternately arranged in the first direction.

In some embodiments of the present disclosure, the plurality of luminous field effect transistors are arranged in such a way that source electrodes of two adjacent luminous field effect transistors in a second direction perpendicular to the first direction are integrated to form the first combined body and drain electrodes of two adjacent luminous field effect transistors in the second direction are integrated to form the second combined body, wherein the first combined body is connected to a power line, and the second combined body is connected to a ground line.

In some embodiments of the present disclosure, the display panel further comprises a switching thin film transistor, a source electrode of the switching thin film transistor being connected to a data line, a gate electrode of the switching thin film transistor being connected to a gate line, and a drain electrode of the switching thin film transistor being electrically connected to the gate electrode of the luminous field effect transistor.

In some embodiments of the present disclosure, the drain electrode does not cover the light emitting layer.

In some embodiments of the present disclosure, orthographic projections of the source electrode and the drain electrode on the active layer each have a tooth shape, comprising a plurality of protruding extensions and recesses between the extensions, at least one extension of the source electrode extends into one recess of the drain electrode, and at least one extension of the drain electrode extends into one recess of the source electrode.

In some embodiments of the present disclosure, orthographic projections of the source electrode and the drain electrode on the active layer each form a shape of a capital letter "F".

In some embodiments of the present disclosure, orthographic projections of the source electrode and the drain electrode on the active layer are two concentric enclosed rings spaced apart from each other.

DETAILED DESCRIPTION OF EMBODIMENTS

Figure 1:
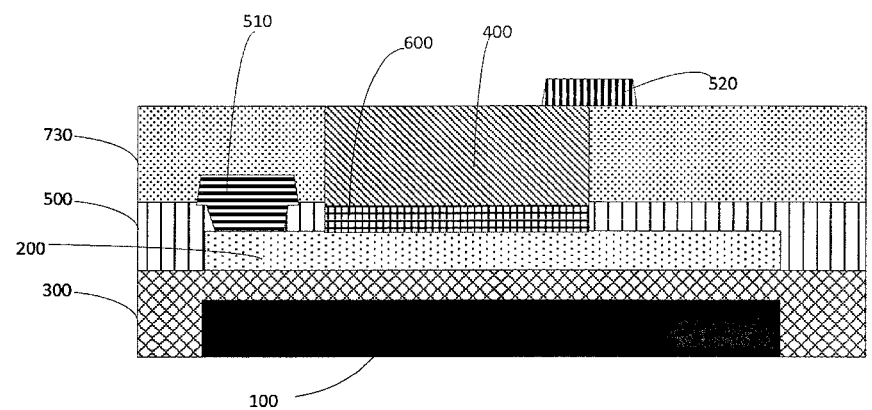
FIG. 1 is a schematic structural view of a luminous field effect transistor according to an embodiment of the present disclosure.

Embodiments of the present disclosure are described in detail below. The embodiments described below are only illustrative for explaining the present disclosure, but are not to be construed as limiting the present disclosure. The specific techniques or conditions not described in the embodiments should be understood in accordance with the techniques or conditions described in the related literatures in the prior art. The used reagents or instruments which are not indicated with manufacturers are conventional products that can be available commercially.

The pixel structure in the current OLED display panel includes an OLED light emitting layer and a driving thin film transistor (DTFT), and a light emitting region of an OLED light emitting layer is covered by a cathode. Since it is affected by factors such as surface plasmon polariton (SPP) or light transmittance, the light exiting efficiency is low. Moreover, the current pixel structure is relatively complicated, and the DTFT occupies a large area, therefore it is disadvantageous to produce a high PPI display panel. The structure and the manufacturing process of the current display panel are complicated, and the product yield is low, which limits its application.

Embodiments of the present disclosure are invented based on the following knowledge and finding of the designer:

The current display panel includes an OLED light emitting layer and a DTFT which are independently provided, a light emitting region of an OLED light emitting layer would be affected by surface plasmon polariton or light transmittance due to being covered by a cathode, so that its light exiting efficiency is low, and the DTFT occupies a relatively large area so that it is disadvantageous to manufacture a high PPI display panel. Therefore, researchers propose an organic luminous field effect transistor, which simplifies the OLED and the DTFT into one component. The luminous field effect transistor itself has the driving function of the DTFT and the light emitting function of the OLED. The combination of the two components makes the pixel structure simpler. The active layers in the current organic luminous field effect transistor are all made of organic materials. In this way, the mobility and electrical conductivity are low, the film thickness is unstable, the stability is poor, and the electrical drift is easy to occur. In view of the above problems, the designer found after making research that, if the active layer is made of inorganic materials, the mobility and electric conductivity may be improved, it can be driven by a small current, it has low power consumption, weak electrical drift and good stability, thereby it can improve the uniformity of the display picture.

In view of this, the embodiments of the present disclosure aim to at least partially solve one of the technical problems in the related art. To this end, an objective of the embodiments of the present disclosure is to provide a luminous field effect transistor having a simple structure, a high yield, a high light exiting efficiency, a low power consumption, or a good stability, and to provide a display panel including such a luminous field effect transistor.

According to an aspect of the present disclosure, an embodiment of the present disclosure provides a luminous field effect transistor. According to the embodiment of the present disclosure, referring to FIG. 1, the luminous field effect transistor includes: a gate electrode 100; an active layer 200 spaced apart from the gate electrode 100 by a gate insulating layer 300; a light emitting layer 400 stacked on a side of the active layer 200 away from the gate electrode 100; and a source electrode 510 and a drain electrode 520, configured in such a way that a current is allowed to flow through the light emitting layer 400 via the active layer 200. The active layer 200 is made of an inorganic semiconductor material, and an energy level transition layer 600 is disposed between the active layer 200 and the light emitting layer 400. The designer found that the luminous field effect transistor having the above structure has a simple structure and is easy to be produced. Moreover, the active layer is formed by using an inorganic semiconductor material, so that the mobility of the active layer is higher, the thickness is more uniform, the stability is better, the process compatibility is better, the electrical conductivity is higher, it can be driven by a smaller current, the power consumption is lower, the electrical drift is weaker, the uniformity of the picture can be effectively improved, the display quality is improved. The arrangement of the energy level transition between the active layer and the light emitting layer allows the energy level of the light emitting layer material and the energy level of the active layer material to match with each other well, thereby improving the operation performance of the luminous field effect transistor.

Figure 2:
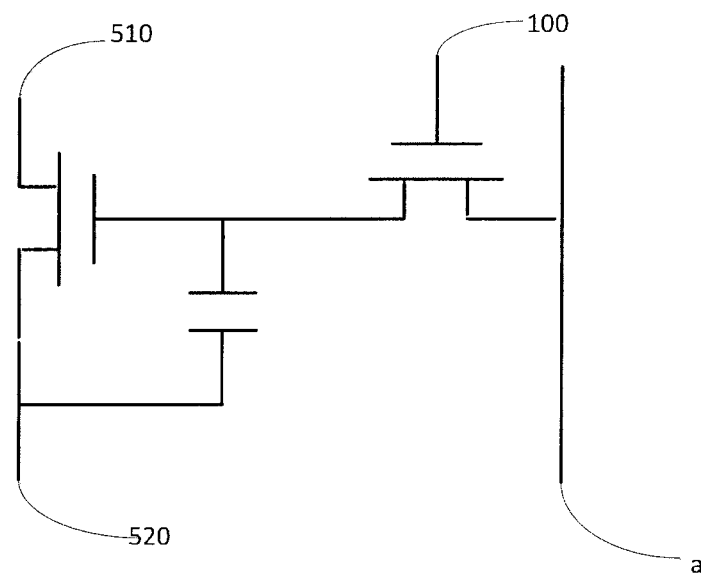
FIG. 2 is a schematic view showing an equivalent circuit of a luminous field effect transistor according to an embodiment of the present disclosure.

According to some embodiments of the present disclosure, an equivalent circuit diagram of each of the luminous field effect transistors may refer to FIG. 2, and the electrodes in the entire luminous field effect transistor include a source electrode 510, a drain electrode 520, and a gate electrode 100, and the source electrode 510 and the drain electrode 520 may be used as a cathode or an anode of the light emitting layer, the switch or the current magnitude of the gate electrode 100 may be controlled by a data signal a, to control the magnitude of the current flowing through the source electrode 510, the drain electrode 520 and the light emitting layer, to further control whether the light emitting layer emits light or size of the illumination intensity of the light emitting layer.

It should be noted that FIG. 1 only exemplarily illustrates specific structure of the luminous field effect transistor, but is not to be construed as limiting the present disclosure. Other forms of luminous field effect transistor are feasible as long as the equivalent circuit diagram thereof is the same as shown in FIG. 2. The shape, installation position, and the like of each part of the luminous field effect transistor may be appropriately adjusted by those skilled in the art according to actual needs.

According to some embodiments of the present disclosure, the inorganic semiconductor material for forming the active layer includes polysilicon, α-silicon, monocrystalline silicon, metal oxide semiconductor (for example, indium gallium zinc oxide (IGZO)), or the like. In this way, the mobility, the thickness uniformity, and the performance stability of the active layer may be further improved, the process compatibility is better, the driving may be realized with a smaller current, and therefore the power consumption is small. According to some embodiments of the present disclosure, the active layer may be a p-type active layer or an n-type active layer.

According to some embodiments of the present disclosure, the energy level of the active layer formed of the inorganic semiconductor material is largely different from the energy level of the light emitting layer. In order to effectively realize conduction of charges, the luminous field effect transistor according to the embodiment of the present disclosure is provided with an energy level transition layer that may be match with the energy level of the active layer, such that the charges can be smoothly electrically conducted among the active layer, the energy level transition layer and the light emitting layer under a suitable voltage. Specifically, in some embodiments of the present disclosure, the active layer is a p-type active layer (i.e., the material for forming the active layer is a p-type inorganic semiconductor material), and a highest occupied molecular orbital of the energy level transition layer matches with a work function of the p-type active layer in terms of energy level, that is, the highest occupied molecular orbital of the energy level transition layer overlaps with the electron orbit of the p-type active layer. Therefore, the energy level matching between the light emitting layer and the active layer can be achieved through the energy level transition layer, thereby achieving a better light emitting effect of the light emitting layer. In still other embodiments of the present disclosure, the active layer is an n-type active layer (i.e., the material for forming the active layer is an n-type inorganic semiconductor material), and a lowest unoccupied molecular orbital of the energy level transition layer matches with a work function of the n-type active layer in terms of energy level, that is, the lowest unoccupied molecular orbital of the energy level transition layer overlaps with the electron orbit of the n-type active layer. Therefore, the energy level matching between the light emitting layer and the active layer can be achieved through the energy level transition layer, thereby achieving a better light emitting effect of the light emitting layer. It should be noted that the term "energy level match or match in terms of energy level" in this specification means: taking the p-type active layer as an example, when the highest occupied molecular orbital of the energy level transition layer is in an energy level match with the work function of the p-type active layer and there is a suitable voltage difference between the source electrode and the drain electrode, the charges can be electrically conducted among the p-type active layer, the energy level transition layer, and the light emitting layer; when the energy level difference between the highest occupied molecule orbital of the energy level transition layer and the work function of the p-type active layer exceeds a certain critical value, no matter how much voltage difference applied between the source electrode and the drain electrode is, the charges cannot be electrically conducted among the p-type active layer, the energy level transition layer, and the light emitting layer. At this time, the highest occupied molecular orbital of the energy level transition layer is not in an energy level match with the work function of the p-type active layer. It should be understood that, if the p-type active layer or the energy level transition layer is made from different materials, the critical value for the energy level difference between the highest occupied molecule orbital of the energy level transition layer and the work function of the p-type active layer is different. Those skilled in the art can select an appropriate energy level transition layer for energy level match with an active layer according to actual needs.

According to some embodiments of the present disclosure, the material for forming the energy level transition layer is not particularly limited, and those skilled in the art can flexibly select it according to actual needs as long as the requirements can be met. In some embodiments of the present disclosure, the material of the energy level transition layer may be an organic material. For example, for an active layer formed form p-type electrically conductive polysilicon, it is necessary to find an organic hole electrically conductive material or a hole injection material that can match with a polysilicon work function of 5.05 eV, as the energy level transition layer material. It may include, but is not limited to, N,N'-diphenyl-N,N'-m-xylene-1,1'biphenyl-4,4'-diamine (TPD) (ion potential energy (LUMO) of 5.1 eV). For an active layer formed from n-type electrically conductive IGZO, 1,3,5-tris(1-phenyl-1H-benzimidazol-2-yl)benzene (TPBi) (LUMO of 2.7 eV) may be used to match it. Therefore, the material source is wide, it allows the energy level of the light emitting layer material and the energy level of the active layer material to match well, the display effect may be improved, and the operation performance may became better.

Figure 3:
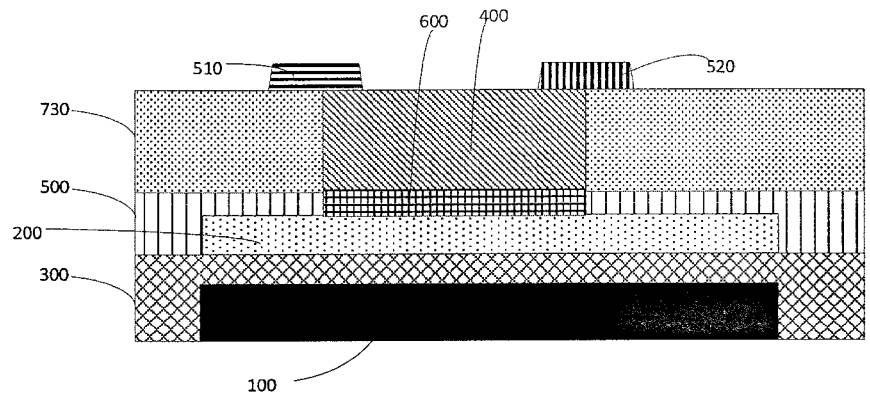
FIG. 3 is a schematic structural view of a luminous field effect transistor according to another embodiment of the present disclosure.

According to some embodiments of the present disclosure, in order to better ensure that the current between the source electrode 510 and the drain electrode 520 can flow through the light emitting layer 400 via the active layer 200 and the field effect transistor has both the driving and light emitting functions, it may adopt the implementation of FIG. 3, in which the source electrode 510 is electrically connected to the light emitting layer 400 and the drain electrode 520 is electrically connected to the light emitting layer 400; it may also adopt the implementation of FIG. 1, in which the source electrode 510 can also be electrically connected to the active layer 200 and the drain electrode 520 is electrically connected to the light emitting layer 400. Therefore, it effectively enables a current flowing between the source electrode and the drain electrode to flow through the light emitting layer via the active layer, and thereby having both a driving function and a light emitting function.

According to some embodiments of the present disclosure, the source electrode may be directly connected to the light emitting layer or the active layer to achieve electrical connection (referring to FIGS. 1 and 3). Next, it is described in detail with reference to an example in which the source electrode may be directly connected to the light emitting layer. Specifically, the source electrode may be disposed on a surface of the light emitting layer away from the active layer, and an orthographic projection of the source electrode on the active layer partially overlaps with an orthographic projection of the light emitting layer on the active layer (referring to FIG. 3). In order to improve the light transmittance of the luminous field effect transistor, the source electrode may be a transparent electrode, thereby the light transmittance of the luminous field effect transistor can be improved.

According to some embodiments of the present disclosure, if the semiconductor material for forming the active layer is an n-type semiconductor material, the source electrode is optionally set as a transparent electrode, while the drain electrode is optionally set as a non-transparent electrode; if the semiconductor material of the active layer is a p-type semiconductor material, the drain electrode is optionally set as a transparent electrode, while the source electrode is optionally set as a non-transparent electrode. In this way, it is advantageous to increase the injection efficiency and improve the photoelectric conversion efficiency.

According to some embodiments of the present disclosure, referring to FIG. 1 or FIG. 3, the drain electrode 520 may be directly connected to the light emitting layer 400 to achieve the electrical connection, and an orthographic projection of the drain electrode on the active layer partially overlaps with an orthographic projection of the light emitting layer on the active layer, and the drain electrode may be a transparent electrode. In this way, the light transmittance of the luminous field effect transistor can be effectively improved.

Figure 4:
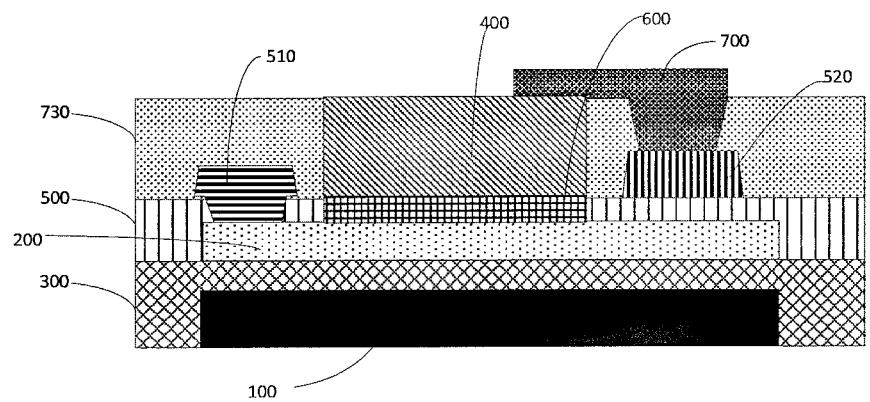
FIG. 4 is a schematic structural view of a luminous field effect transistor according to a further embodiment of the present disclosure.

According to some embodiments of the present disclosure, referring to FIG. 4, the drain electrode 520 may also be indirectly electrically connected to the light emitting layer 400. In order to achieve the electrical connection between the drain electrode 520 and the light emitting layer 400, the luminous field effect transistor further includes a connection electrode 700. The light emitting layer 400 and the drain electrode 520 are electrically connected to each other via the connection electrode 700. In this way, it is beneficial to simplify the manufacturing process, and it allows a better electrical connection effect of the drain electrode and the light emitting layer. According to some embodiments of the present disclosure, an orthographic projection of the connection electrode on the active layer partially overlaps with an orthographic projection of the light emitting layer on the active layer. In this way, the structure is simple and it is easy to implement, and the connection electrode does not completely cover the light emitting layer, the light emitted from the light emitting layer does not need to be emitted out through the connection electrode, and thereby the light utilization efficiency is higher.

According to some embodiments of the present disclosure, the connection electrode may be a transparent electrode, and the material for forming the connection electrode is not particularly limited, and those skilled in the art can flexibly select it according to actual needs as long as the requirements can be met. For example, the material for forming the connection electrode may include, but is not limited to, a transparent electrically conductive oxide (for example, indium tin oxide, zinc tin oxide, and the like), nano-scale metal silver or $Cs_2CO_3$, and the like. The method for forming the connection electrode is not particularly limited, and those skilled in the art can flexibly select it according to actual needs as long as the requirements can be met. For example, the method for forming the connection electrode may be a mask thermal evaporation method or the like.

It can be seen that at least one of the drain electrode or the connection electrode may be a transparent electrode. In this way, the light emitting area can be further increased, and the light utilization efficiency can be improved.

According to some embodiments of the present disclosure, the material for forming the source electrode, the drain electrode or the gate electrode is not particularly limited, and those skilled in the art can flexibly select it according to actual needs as long as it has an energy level suitable for electron injection. For example, the material for forming the source electrode, the drain electrode or the gate may be metal, alloy, electrically conductive polymer, indium tin oxide, indium gallium zinc oxide or the like.

Figure 5:
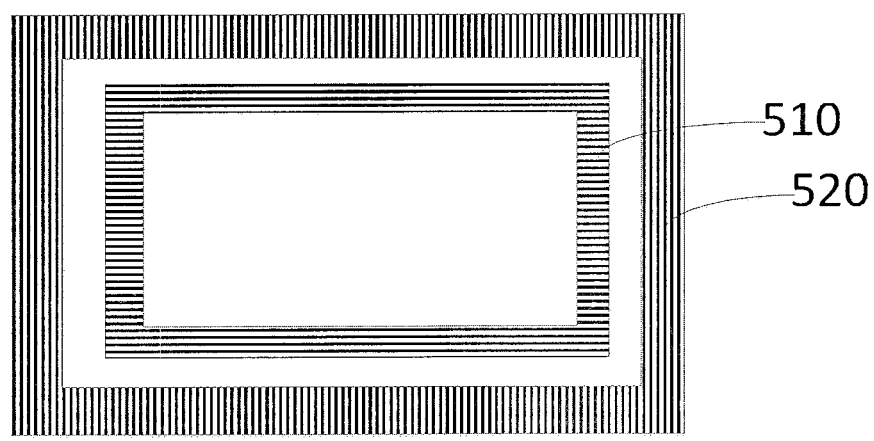
FIG. 5 is a schematic structural view showing orthographic projections of a source electrode and a drain electrode onto an active layer according to an embodiment of the present disclosure.
Figure 6:
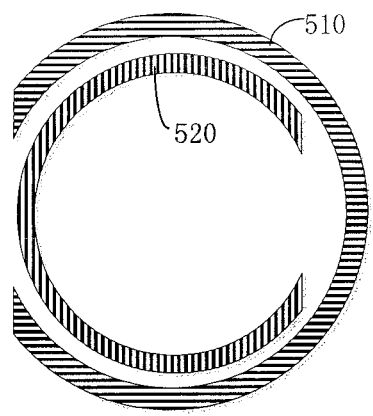
FIG. 6 is a schematic structural view showing orthographic projections of a source electrode and a drain electrode onto an active layer according to another embodiment of the present disclosure.
Figure 7:
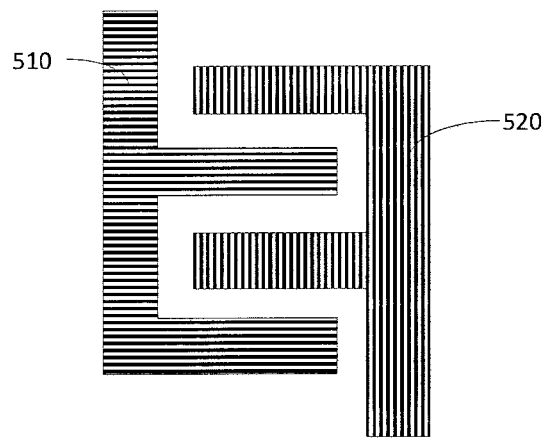
FIG. 7 is a schematic structural view showing orthographic projections of source electrodes and drain electrodes of a plurality of luminous field effect transistors onto active layers according to an embodiment of the present disclosure.

According to some embodiments of the present disclosure, in order to obtain a large channel current, the shapes of the source electrode and the drain electrode may be designed in such a way that they have a large aspect ratio. In some embodiments of the present disclosure, referring to FIG. 5, the orthographic projections of the source electrode 510 and the drain electrode 520 on the active layer 200 are two concentric rings spaced apart from each other. The above-mentioned rings should be understood in a broad sense, the rings may be enclosed rings, for example, square rings shown in FIG. 5 or circular rings or other enclosed rings, or may be non-enclosed rings, for example, U-shaped or C-shaped rings, which is not limited herein. The C-shaped structure may specifically refer to FIG. 6. In this way, the aspect or width-to-length ratio of the channel can be increased, and thereby the channel current can be increased. Moreover, the effect of surface light emission can be obtained, the uniformity of light can be improved, and thereby the display effect can be improved. It should be noted that, when the orthographic projections of the source electrode and the drain electrode on the active layer are two concentric rings spaced apart from each other, two adjacent source electrodes or drain electrodes may be integrated by punching and wiring. In still other embodiments of the present disclosure, referring to FIG. 7, the orthographic projections of the source electrode 510 and the drain electrode 520 on the active layer 200 are comb-like, and comb teeth are disposed in such a way that they cross each other to form an arcuate channel Specifically, the orthographic projections of the source electrode 510 and the drain electrode 520 on the active layer 200 each have a tooth shape, including a plurality of protruding extensions and recesses between the extensions, the extension of the source electrode 510 extends into the recess of the drain electrode 520, and the extension of the drain electrode 520 extends into the recess of the source electrode 510. In FIG. 7, the orthographic projections of the source electrode 510 and the drain electrode 520 on the active layer 200 each form a shape like a letter "F". In this way, the width-to-length ratio (W/L) of the channel can be increased, and thereby the channel current can be increased. Moreover, since the pixels are small, the line type light emission actually appears to be surface light emission, which can improve the uniformity of light and improve the display quality of the display device.

According to some embodiments of the present disclosure, the light emitting layer may be an organic electroluminescence layer, and the structure of the light emitting layer is not particularly limited, those skilled in the art can flexibly select it according to actual needs as long as the light emitting requirements can be met. For example, the light emitting layer may include at least one of a hole transport layer (HTL), a hole injection layer, a hole blocking layer (HBL), an electron transport layer (ETL), an electron injection layer, or an electron blocking layer, in addition to the basic organic electroluminescence layer. In this way, the structure is simple, it is easy to implement, and the light emitting effect is better. According to some embodiments of the present disclosure, the materials for forming the various layers of the light emitting layer are materials for the conventional light emitting layer, and details thereof will not be described herein again.

According to some embodiments of the present disclosure, the material for forming the gate insulating layer is not particularly limited, and those skilled in the art can flexibly select it according to actual needs as long as the requirements can be met. For example, the material for forming the gate insulating layer may include, but is not limited to, silicon dioxide, silicon nitride, conjugated polyvinyl carbazole, or the like. In this way, the insulating effect is better and the operation performance is better.

According to another aspect of the present disclosure, some embodiments of the present disclosure provide a display panel. According to some embodiments of the present disclosure, the display panel includes a plurality of the aforementioned luminous field effect transistors. The designer has found that this display panel has a simple structure, and it is easy to implement, the display panel has a better display effect and a better operation performance, and has all the characteristics and advantages of the aforementioned luminous field effect transistor, which will not be described in detail herein.

Figure 8:
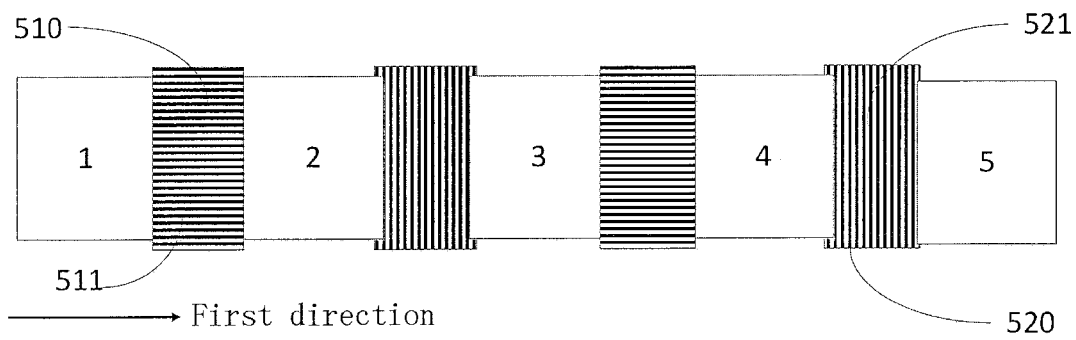
FIG. 8 is a schematic structural view of source electrodes and drain electrodes of a plurality of luminous field effect transistors according to another embodiment of the present disclosure.
Figure 9:
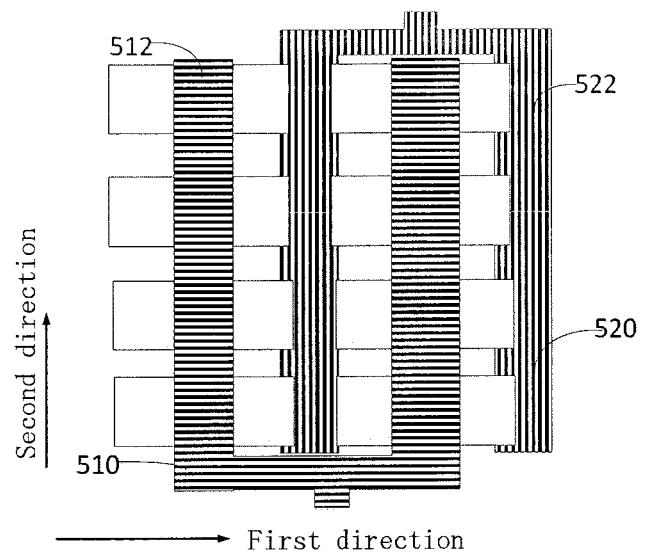
FIG. 9 is a partial plan view for schematically showing a structure of a display panel according to an embodiment of the present disclosure.
Figure 10:
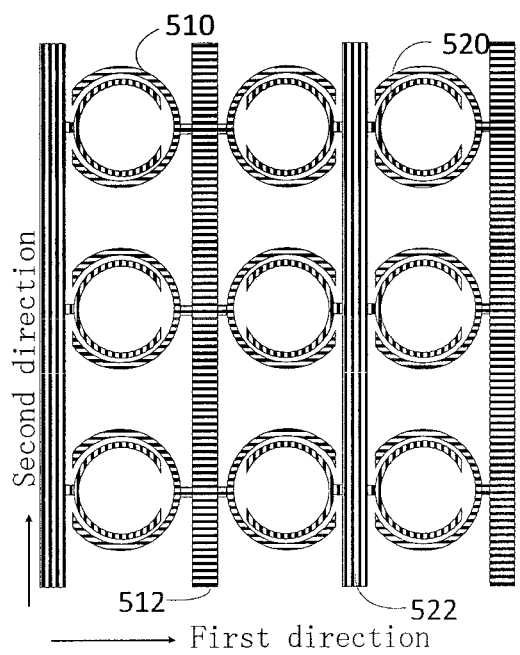
FIG. 10 is a partial plan view for schematically showing a structure of a display panel according to another embodiment of the present disclosure.

According to some embodiments of the present disclosure, the plurality of luminous field effect transistors are arranged in such a way that source electrodes of two adjacent luminous field effect transistors in a first direction are integrated to form a first combined body and drain electrodes of two adjacent luminous field effect transistors in the first direction are integrated to form a second combined body, wherein the first combined body and the second combined body are alternately arranged in the first direction. The structures of the source electrodes and the drain electrodes in the luminous field effect transistors will be described below by taking five luminous field effect transistors as an example. Specifically, referring to FIG. 8, the five luminous field effect transistors are respectively labeled by 1, 2, 3, 4, and 5. representing the luminous field effect transistors 1 to 5, the luminous field effect transistors 1 and 2 are adjacent in a first direction, the source electrodes 510 of these two luminous field effect transistors are integrated to form a first combining body 511, and the drain electrode 520 of the luminous field effect transistor 2 is integrated with the drain electrode 520 of the adjacent luminous field effect transistor 3 to form a second combined body 521, and then the source electrode 510 of the luminous field effect transistor 3 is integrated with the source electrode 510 of the adjacent luminous field effect transistor 4 in the first direction to form the first combined body 511, similarly, the drain electrodes 520 of the adjacent luminous field effect transistors 4 and 5 in the first direction are integrated to form the second combined body 521. In this way, the pixel circuit can be simplified, the line width can be increased, and the resistance can be reduced. It should be noted that the above examples are merely exemplary and are only used to illustrate the present disclosure, but are not to be construed as limiting the present disclosure. Those skilled in the art may select an appropriate number of luminous field effect transistors according to the needs for different display panels and adaptively set the structure and connection mode of the source electrodes and drain electrodes of the luminous field effect transistors. According to a specific example of the present disclosure, referring to FIG. 9, a plurality of luminous field effect transistors are spaced apart and arranged in an array, and the plurality of luminous field effect transistors are arranged in such a way that the source electrodes 510 of all the luminous field effect transistors adjacent in a second direction perpendicular to the first direction are integrated to form a first combined body 512, and the drain electrodes 520 of all the luminous field effect transistors adjacent in the second direction are integrated to form a second combined body 522, the first combined body 512 is connected to a power line, and the second unit 522 is connected to a ground line. In this way, the pixel circuit can be further simplified, the line width is increased, and the resistance is reduced. According to another specific example of the present disclosure, when the orthographic projections of the source electrode 510 and the drain electrode 520 on the active layer 200 are two concentric rings spaced apart from each other, the schematic structure of the source electrodes 510 and the drain electrodes 520 of the plurality of luminous field effect transistors spaced apart and arranged in an array may refer to FIG. 10, the source electrodes 510 of all the luminous field effect transistors adjacent in the second direction perpendicular to the first direction are integrated to form the first combined body 512, the drain electrodes 520 of all the luminous field effect transistors adjacent in the second direction are integrated to form the second combined body 522, the first combined body 512 is connected to a power line, and the second combined body 522 is connected to a ground line. In this way, the pixel circuit can be further simplified, the line width is increased, and the resistance is reduced. It should be noted that the integration of the source electrodes and the drain electrodes described above should be understood in a broad sense. The integration may refer to that two source electrodes or drain electrodes adjacent in the first direction or the second direction are made to become an integral body during the manufacturing process (for example a wire constitutes two source electrodes or drain electrodes adjacent in the first or second direction), or two separate source electrodes or drain electrode are first formed and then the two source electrodes or drain electrodes adjacent in the first direction or the second direction are electrically connected by punching and wiring (for example, two separately-provided source electrodes or drain electrodes adjacent in the first direction or the second direction are electrically connected to each other by a wire) to achieve the integration. In this way, the structure is simple, it is easy to implement, and the pixel circuit can be simplified.

Figure 11:
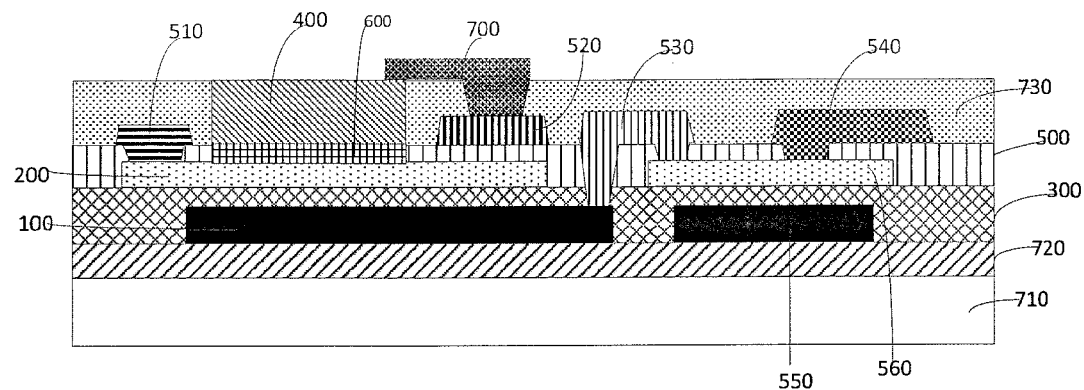
FIG. 11 is a partial cross-sectional view for schematically showing a structure of a display panel according to another embodiment of the present disclosure.
Figure 13:
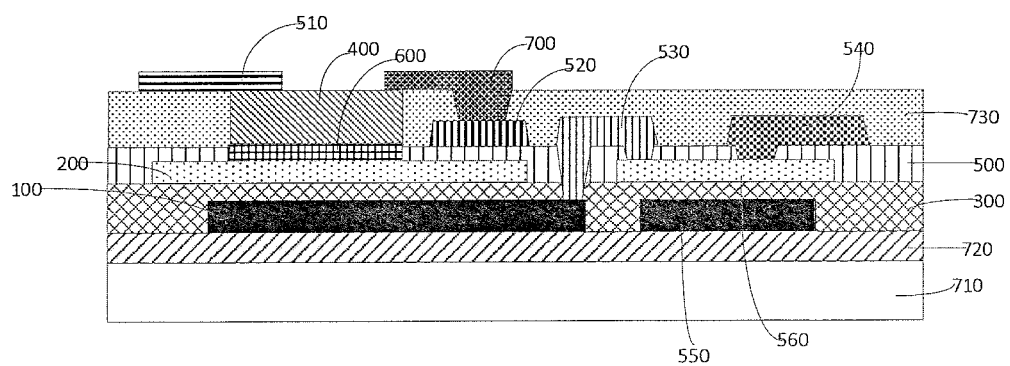
FIG. 13 is a partial cross-sectional view for schematically showing a structure of a display panel according to another embodiment of the present disclosure.

According to some embodiments of the present disclosure, in order to realize the display function of the display device, referring to FIG. 11 and FIG. 13, the display panel includes a switching thin film transistor, a source electrode 540 of the switching thin film transistor is connected to a data line, a gate electrode 550 of the switching thin film transistor is connected to a gate line, and a drain electrode 530 of the switching thin film transistor is electrically connected to the gate electrode 100 of the luminous field effect transistor. In this way, the structure is simple, it is easy to implement, and it can save cost. Moreover, the thin film transistor may be effectively used for controlling the switch of the luminous field effect transistor to realize the display function of the display device.

According to some embodiments of the present disclosure, the display panel may be classified into a bottom source-top drain type display panel or a top source-bottom drain type display panel according to difference in the positions of the source electrode and drain electrode.

Figure 12:
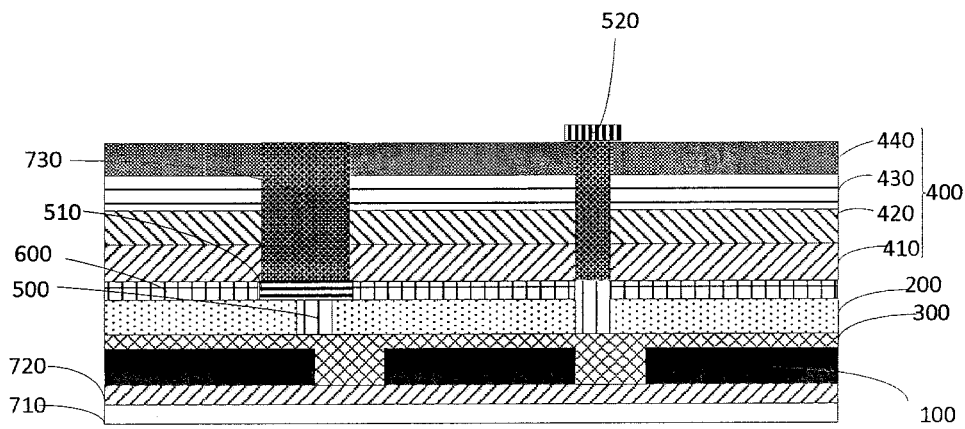
FIG. 12 is a partial cross-sectional view for schematically showing a structure of a display panel according to another embodiment of the present disclosure.

According to some embodiments of the present disclosure, referring to FIG. 11, the bottom source-top drain type display panel includes, in addition to the foregoing luminous field effect transistor and switching thin film transistor, a base substrate 710; a buffer layer 720 disposed on one surface of the base substrate 710; an interlayer dielectric layer 500 disposed on a surface of the gate insulating layer 300 away from the base substrate 710 and covering the active layer 200 and an active layer 560 of the switching thin film transistor; a pixel defining layer 730 disposed on a surface of the interlayer dielectric layer 500 away from the base substrate 710 and covering the source electrode 510, the drain electrode 520, the drain electrode 530 of the switching thin film transistor, and the source electrode 540 of the switching thin film transistor. The luminous field effect transistor is disposed on a surface of the buffer layer 720 away from the base substrate 710, the switching thin film transistor is disposed on a surface of the buffer layer 720 away from the base substrate 710, the source electrode 510 of the luminous field effect transistor is electrically connected to the active layer 200, the drain electrode 520 is electrically connected to the light emitting layer 400 via the connection electrode 700, the connection electrode 700 is connected to the drain electrode 520 through a via hole to form the actual drain electrode in the bottom source-top drain type display panel. The illumination principle of the panel refer to that holes are directly injected from the source electrode 510 into the active layer 200 and flow through the energy level transition layer 600 and the electroluminescence layer in the light emitting layer 400 toward the drain electrode 520, electrons are injected from the drain electrode 520 to the electroluminescence layer, then the electrons and the holes converge in the electroluminescence layer, annihilate and emit light. In the bottom source-top drain type display panel, the injected holes and electrons flow obliquely in the channel towards the opposite poles, increasing the probability of exciton formation, thereby improving the operation performance of the display panel. FIG. 12 is a cross-sectional view of a bottom source-top drain type display panel, the drain electrodes 520 of two adjacent luminous field effect transistors may be integrated by wires, and two source electrodes 510 from one of the two adjacent luminous field effect transistors and a third luminous field effect transistor adjacent thereto may also be integrated by wires, thereby simplifying the structure, realizing the simplification of the circuit, and saving cost. Moreover, the structure of the source electrode, the connection electrode and the drain electrode is longitudinally asymmetrical, which is beneficial to increase the probability of combination of electrons and holes, and increase the photoelectric conversion efficiency of the luminous field effect transistor. The source electrode may serve as an anode of the light emitting layer, the drain electrode may serve as a cathode of the light emitting layer, the anodes of two adjacent luminous field effect transistors may share a single wiring, two cathodes from one of the two adjacent luminous field effect transistors and a third luminous field effect transistor adjacent thereto may also share a single wiring, thereby increasing the wiring area, reducing the wiring resistance, and reducing the tolerance of the etch process.

Figure 14:
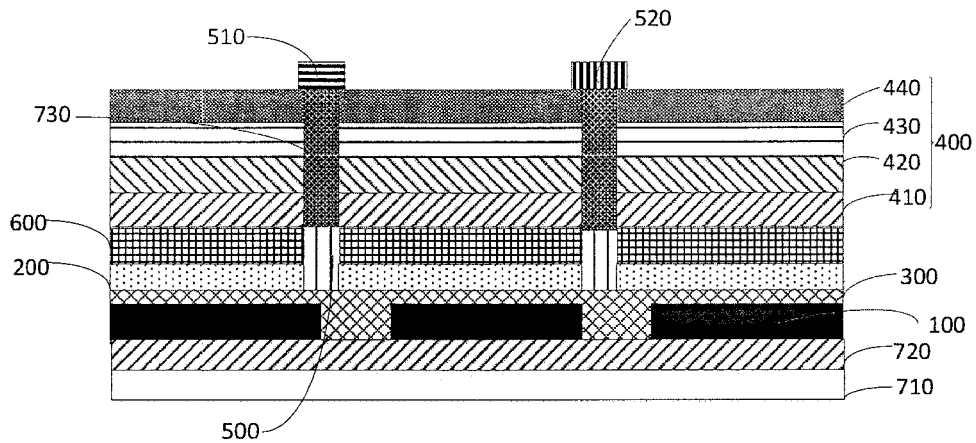
FIG. 14 is a partial cross-sectional view for schematically showing a structure of a display panel according to another embodiment of the present disclosure.

According to some embodiments of the present disclosure, referring to FIG. 13, the top source-bottom drain type display panel is different from the structure of the bottom source-top drain type display panel in that: the source electrode 510 is in contact with a portion of a surface of the light emitting layer 400 away from the active layer 200 to electrically connect the source electrode 510 to the light emitting layer 400. The connection electrode 700 and the drain electrode 520 are connected to each other through a via hole to form an actual drain electrode of the top source-bottom drain type display panel. The illumination principle of the panel refers to that: after the holes are injected from the source electrode 510, they flow through the light emitting layer 400 to the active layer 200, then flow along the active layer 200 toward the side of the connection electrode 700, and flow again through the electroluminescence layer in the light emitting layer 400 toward the drain electrode 520, and the electrons are injected from the drain electrode 520 to the electroluminescence layer, then the electrons and the holes converge in the light emitting layer, annihilate and emit light. FIG. 14 is a cross-sectional view of a display panel including a top source-bottom drain type structure, in which the drain electrodes 520 of two adjacent luminous field effect transistors may be integrated by wires, and two source electrodes 510 from one of the two adjacent luminous field effect transistors and a third luminous field effect transistor adjacent thereto may also be integrated by wires, thereby simplifying the structure, realizing the simplification of the circuit, saving cost, and facilitating the simplification of the manufacturing process (for example, the source electrode and the connection electrode may be formed by one process). In addition, the source electrode may serve as an anode of the light emitting layer, the drain electrode may serve as a cathode of the light emitting layer, the anodes of two adjacent luminous field effect transistors may share a single wiring, two cathodes from one of the two adjacent luminous field effect transistors and a third luminous field effect transistor adjacent thereto may also share a single wiring, thereby increasing the wiring area, reducing the trace resistance, and reducing the tolerance of the etch process.

It should be noted that, in a case where the source electrodes or drain electrodes of two adjacent luminous field effect transistors are connected by wires, the gate electrode is time-divisionally driven to meet the display requirements of the display device.

According to some embodiments of the present disclosure, referring to FIG. 12 and FIG. 14, the light emitting layer 400 further includes: a hole transport layer 410, an electroluminescence layer 420 disposed on a surface of the hole transport layer 410 away from the base substrate 710, and a hole blocking layer 430 disposed on a surface of the electroluminescence layer 420 away from the base substrate 710, and an electron transport layer 440 disposed on a surface of the hole blocking layer 430 away from the base substrate 710. In this way, the structure is simple and it is easy to implement, and it can effectively achieve electroluminescence and the illumination efficiency is higher. According to some embodiments of the present disclosure, the hole transport layer, the electroluminescence layer, the hole blocking layer, and the electron transport layer are identical to the conventional hole transport layer, electroluminescence layer, hole blocking layer, and electron transport layer, therefore they will not be described in detail herein.

According to another aspect of the present disclosure, some embodiments of the present disclosure provide a display device. According to some embodiments of the present disclosure, the display device includes the display panel described above. The designer has found that the display panel of the display device has a higher PPI, a higher display quality, and a better operation performance, and the display device has all the characteristics and advantages of the display panel described above, which will not be described in detail herein.

According to some embodiments of the present disclosure, the above display panel is consistent with the foregoing description, and therefore the details would not be described herein again. According to some embodiments of the present disclosure, the display device includes, in addition to the display panel described above, components that the conventional display device should have, such as a protective cover plate, a polarizer, a touch substrate, a planarization layer, a package structure or the like, which will not be described in detail herein.

According to another aspect of the present disclosure, some embodiments of the present disclosure provide a method of manufacturing a display panel. According to some embodiments of the present disclosure, the method includes: forming a plurality of luminous field effect transistors distributed in an array on a first surface of a base substrate.

It should be noted that the first surface refers to a surface close to the user when the display panel is in use. In addition, FIG. 11 and FIG. 13 are schematic cross-sectional structural views of a luminous field effect transistor and a switching transistor in the display panel, and FIG. 12 and FIG. 14 are schematic cross-sectional structural views of three sub-pixels in the display panel.

Figure 15:
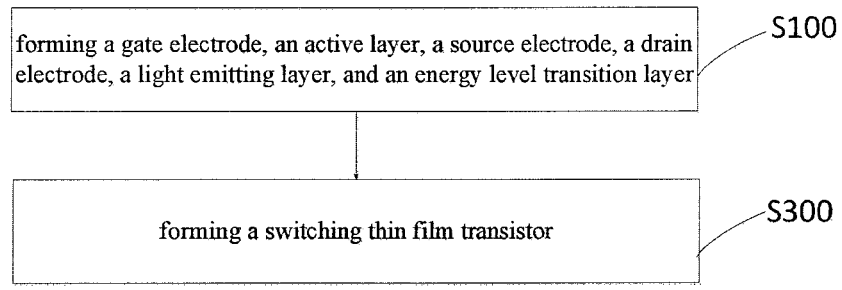
FIG. 15 is a schematic flow chart of a method of manufacturing a display panel according to an embodiment of the present disclosure.

According to some embodiments of the present disclosure, referring to FIG. 15, the steps of forming the luminous field effect transistor include:

S100: forming a gate electrode 100, an active layer 200, a source electrode 510, a drain electrode 520, a light emitting layer 400, and an energy level transition layer 600, the schematic structural views may refer to FIG. 1, FIG. 3 or FIG. 4;

S300: forming a switching thin film transistor.

According to some embodiments of the present disclosure, the gate electrode, the active layer, the source electrode, the drain electrode, the light emitting layer, and the energy level transition layer are consistent with the foregoing description, and therefore no further details would be provided herein.

According to some embodiments of the present disclosure, the way the gate electrode is formed may be etching or deposition; the active layer may be formed by etching first and then excimer laser annealing or excimer laser annealing first and then etching, or wet etching; the way the source electrode and the drain electrode are formed may be a thermal evaporation method or a sputtering etching method; and the way the energy level transition layer is formed is generally thermal evaporation deposition. In this way, it is simple and convenient to operate, and it is easy to implement, and the product yield is high.

According to some embodiments of the present disclosure, the step of forming the light emitting layer further includes the steps of forming a hole transport layer, an electroluminescence layer, a hole blocking layer, and an electron transport layer. The way the hole transport layer, the electroluminescence layer, the hole blocking layer and the electron transport layer are formed may be a thermal evaporation method. In this way, the structure or process is simple, and the formed light emitting layer has better applicability.

Figure 16:
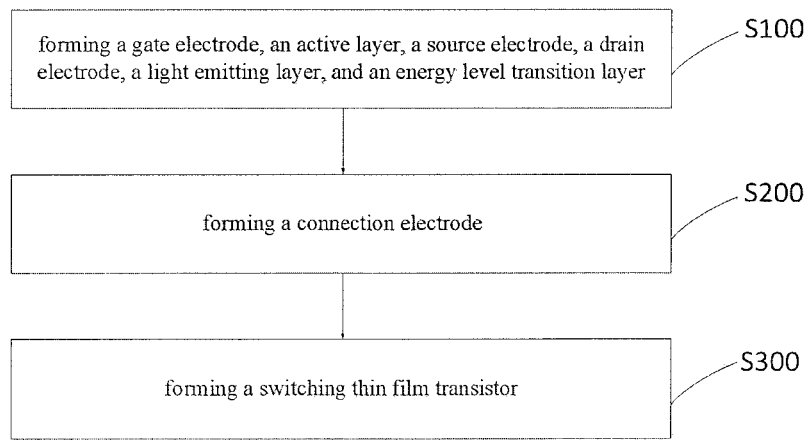
FIG. 16 is a schematic flow chart of a method of manufacturing a display panel according to another embodiment of the present disclosure.
Figure 17:
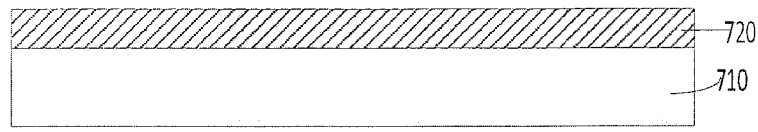
FIGS. 17 to 24 illustrate structures obtained in various stages of a method of manufacturing a display panel according to an embodiment of the present disclosure.
Figure 18:
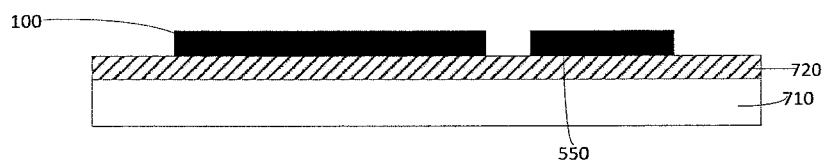
Figure 19:
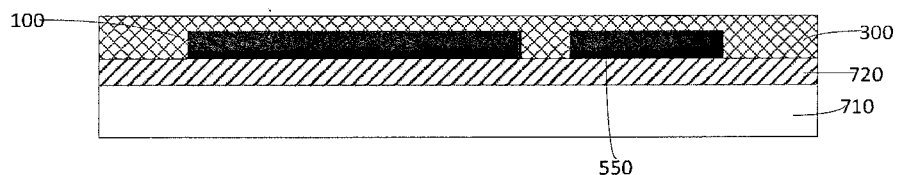
Figure 20:
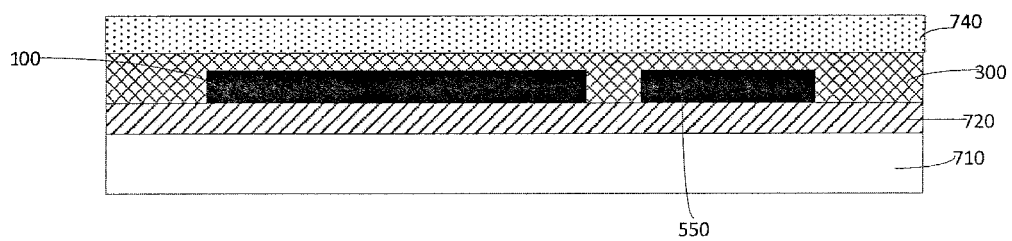
Figure 21:
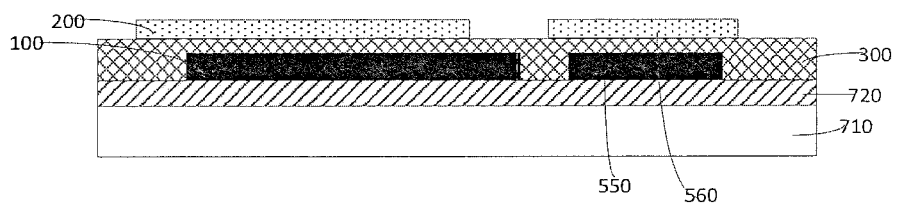
Figure 22:
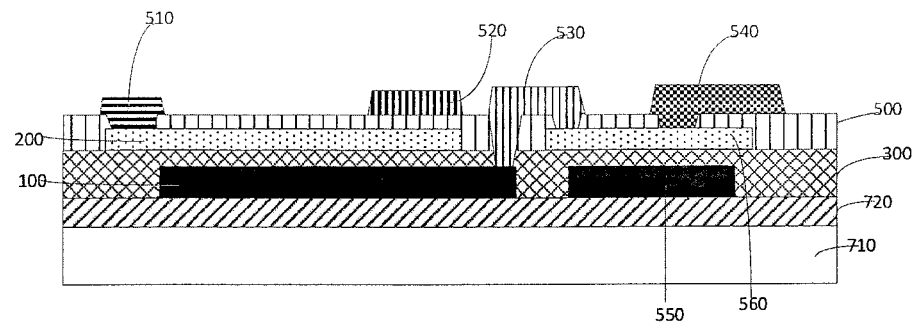
Figure 23:
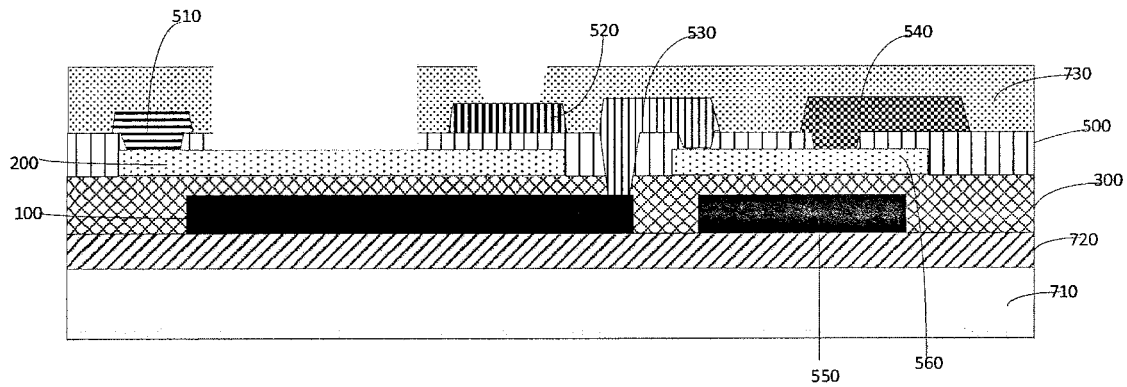
Figure 24:
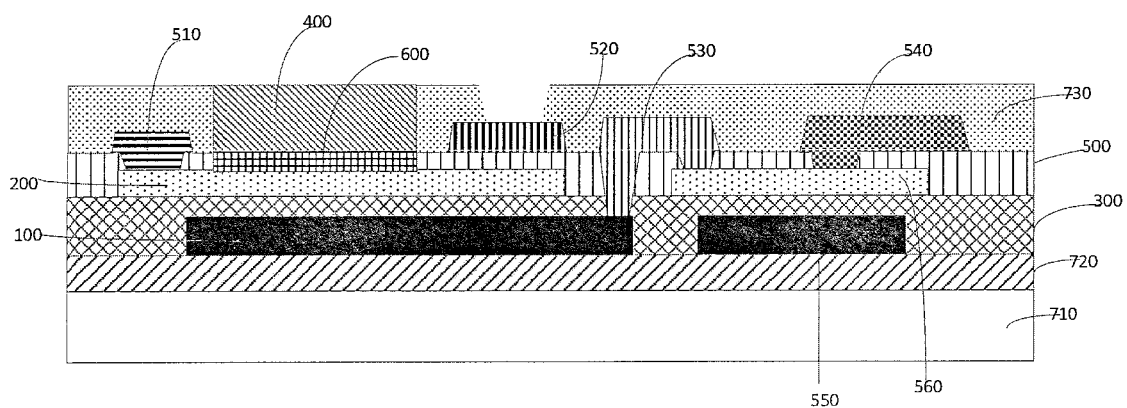

In some embodiments of the present disclosure, referring to FIG. 16, the above method may further include:

S200: forming a connection electrode 700, the schematic structural view thereof may refer to FIG. 4.

According to some embodiments of the present disclosure, the connection electrode is consistent with the foregoing description, and therefore it will not be further described herein. According to some embodiments of the present disclosure, the way the connection electrode is formed may be a thermal evaporation method or the like.

According to some embodiments of the present disclosure, in the bottom source-top drain type display panel or the top source-bottom drain type display panel, the source electrode and the connection electrode are formed by one patterning process, thereby making the manufacturing process simple, convenient, and cost-effective and achieving a higher product yield. According to some embodiments of the present disclosure, the patterning process may be a mask thermal evaporation process or the like.

According to some embodiments of the present disclosure, the above-described switching thin film transistor is consistent with the foregoing description, and therefore it will not be described in detail herein. According to some embodiments of the present disclosure, forming the switching thin film transistor further includes the steps of forming a gate electrode, a source electrode, a drain electrode, and an active layer of the switching thin film transistor. According to some embodiments of the present disclosure, the way the gate electrode of the switching thin film transistor is formed may be etching or deposition, and the way the source electrode and the drain electrode of the switching thin film transistor are formed may be thermal evaporation or sputtering etching. In this way, the manufacturing process is simple, convenient, and cost-effective, and the switching thin film transistor can be effectively used for controlling the switch of the sub-pixels to realize the display function of the display device.

The designer found that the above process is simple and it is easy to implement, and the cost is low, the structure of the manufactured display panel is greatly simplified, the product yield is improved, the light exiting efficiency is high, and it is suitable for manufacturing high PPI products.

Next, specific processes for manufacturing a bottom source-top drain type display panel will be provided as an example to specifically describe the method of manufacturing a display panel according to some embodiments of the present disclosure. Referring to FIG. 17 to FIG. 24 and FIG. 11, it should be noted that the following described examples are illustrative only for explaining the present disclosure, but are not to be construed as limiting the present disclosure.

1. A base substrate 710 is cleaned, and a buffer layer 720 is formed on a surface of the base substrate 710, and the schematic structural view thereof may refer to FIG. 17.

2. A gate electrode 100 and a gate electrode 550 of the switching thin film transistor are formed on a surface of the buffer layer 720 away from the base substrate 710, and the schematic structural view thereof may refer to FIG. 18.

3. A gate insulating layer 300 is formed on the surface of the buffer layer 720 away from the base substrate 710, so that the gate insulating layer covers the gate electrode 100 and the gate electrode 550 of the switching thin film transistor, and the schematic structural view thereof may refer to FIG. 19.

4. An initial active layer 740 is formed on a surface of the gate insulating layer 300 away from the base substrate 710, and the schematic structural view thereof may refer to FIG. 20.

5. The initial active layer 740 is patterned to form an active layer 200 and an active layer 560 of the switching thin film transistor, and the schematic structural view thereof may refer to FIG. 21.

6. An interlayer dielectric layer 500 is formed on the surface of the gate insulating layer 300 away from the base substrate 710, so that the interlayer dielectric layer covers the active layer 200 and the active layer 560 of the switching thin film transistor, holes are formed in the interlayer dielectric layer 500 by punching, and a source electrode 510, a drain electrode 520, a drain electrode 530 of the switching thin film transistor and a source electrode 540 of the switching thin film transistor are deposited, and the schematic structural view thereof may refer to FIG. 22.

7. A pixel defining layer 730 is formed on a surface of the interlayer dielectric layer 500 away from the base substrate 710, so that it covers the source electrode 510, the drain electrode 520, the drain electrode 530 of the switching thin film transistor, and the source electrode 540 of the switching thin film transistor. After that, the pixel defining layer 730 and the interlayer dielectric layer 500 are patterned to define positions of an energy level transition layer, a light emitting layer and a connection electrode which all are to be formed in subsequent steps, and the schematic structural view thereof may refer to FIG. 23.

8. The energy level transition layer 600 and the light emitting layer 400 are formed by an evaporation method, wherein the light emitting layer 400 is disposed on a surface of the energy level transition layer 600 away from the base substrate 710, and the schematic structural view thereof may refer to FIG. 24.

9. The connection electrode 700 (i.e., a cathode) is formed by a mask evaporation method, and the schematic structural view thereof may refer to FIG. 11.

In accordance with some embodiments of the present disclosure, in a general display panel, the OLED and the DTFT are independently arranged, and the OLED light emitting layer has a low light exiting efficiency due to being covered by the cathode. Moreover, since the DTFT occupies a relatively large area, it is disadvantageous to manufacture a high PPI display panel. Thus, its application is limited by it. In the embodiments of the present disclosure, a luminous field effect transistor is used to take place of the OLED light emitting layer and the DTFT, the luminous field effect transistor itself has the driving function of the DTFT and the light emitting function of the OLED light emitting layer, therefore the structure of the display panel becomes simpler, the manufactured display screen is thinner, the number of the processes is reduced, the product yield is higher. Moreover, the inorganic active layer is used to drive the light emitting layer to emit light, so that it can be driven by a smaller current, the power consumption is low, the mobility thereof is high, the electric conductivity is high, and the electrical drift is weak, the stability is better, and the process compatibility is better. Furthermore, a transition layer is provided between the inorganic active layer and the light emitting layer to make the energy level of the light emitting layer material and the energy level of the active layer material match with each other better, improving the display effect. In addition, at least a portion of the light emitting region of the luminous field effect transistor is out of the coverage range of the cathode, and therefore would not be affected by factors such as surface plasmon polariton or light transmittance, the light exiting efficiency is high. More importantly, the own light emitting region of the luminous field effect transistor is smaller than the OLED light emitting layer, and therefore it is suitable for producing a high PPI display panel.

Figure 25:
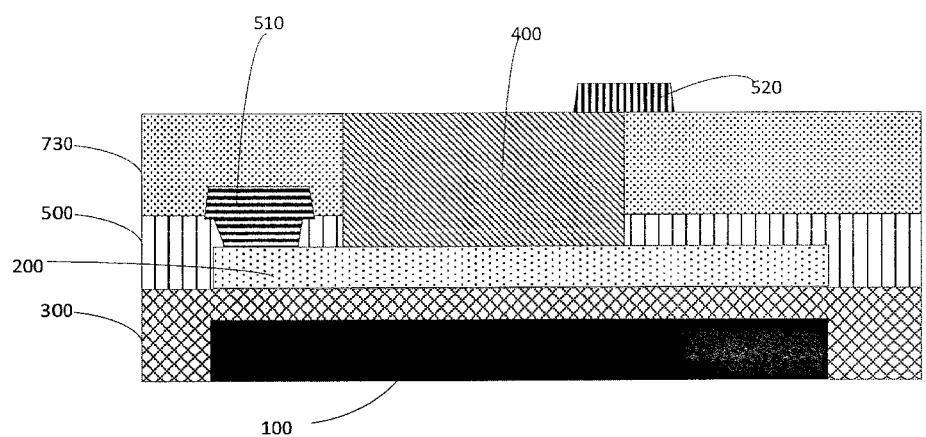
FIG. 25 is a schematic structural view of a luminous field effect transistor according to a still further embodiment of the present disclosure.

In the embodiments of the present disclosure, the arrangement of the energy level transition layer is intended to compensate for the large difference between the energy level of the active layer formed of the inorganic semiconductor material and the energy level of the light emitting layer. The arrangement of the energy level transition layer between the active layer and the light emitting layer may allow the energy level of the light emitting layer material and the energy level of the active layer material to match with each other well, thereby improving the operation performance of the luminous field effect transistor. However, it should be noted that the energy level transition layer is not indispensable, especially when the energy level difference between the active layer and the light emitting layer is not significant. FIG. 25 is a luminous field effect transistor according to an embodiment of the present disclosure, which differs from the embodiment illustrated in FIG. 1 in that: no energy level transition layer is disposed between the active layer 200 and the light emitting layer 400. Specifically, the luminous field effect transistor includes: a gate electrode 100; an active layer 200 spaced apart from the gate electrode 100 by a gate insulating layer 300; a light emitting layer 400 disposed on a side of the active layer 200 away from the gate electrode 100; and a source electrode 510 and a drain electrode 520 configured in such a way that a current is allowed to pass through the active layer 200 via the light emitting layer 400, wherein the active layer 200 is made of an inorganic semiconductor material. The luminous field effect transistor having the above structure may be configured to be a display panel for display application, and it has a simple structure and is easy to implement. Moreover, the active layer is formed by using an inorganic semiconductor material, so that the mobility of the active layer is higher, the thickness is more uniform, the stability is better, the process compatibility is better, the electrical conductivity is higher, it can be driven by a smaller current, the power consumption is lower, the electrical drift is weaker, the uniformity of the display can be effectively improved, and the display quality is improved.

While the embodiments of the present disclosure have been shown and described above, it should be understood that the above embodiments are illustrative and are not to be construed as limiting the present disclosure. Changes, modifications, substitutions and variations may be made to the above embodiments by those skilled in the art within the scope of the present disclosure.

What is claimed is:

1. A display panel, comprising:
   a base substrate;
   a gate electrode on the base substrate;
   an active layer spaced apart from the gate electrode by a gate insulating layer;
   a light emitting layer disposed on a side of the active layer away from the gate electrode; and a source electrode and a drain electrode, configured in such a way that a current is allowed to flow through the light emitting layer via the active layer, wherein an energy level transition layer is provided between the active layer and the light emitting layer.

2. The display panel according to claim 1, wherein the active layer is made of an inorganic semiconductor material.

3. The display panel according to claim 2, wherein the inorganic semiconductor material comprises at least one of polysilicon, monocrystalline silicon, or metal oxide semiconductor.

4. The display panel according to claim 1, wherein orthographic projections of the source electrode and the drain electrode on the active layer are two concentric non-enclosed rings spaced apart from each other.

5. The display panel according to claim 1, wherein the source electrode and the active layer are electrically connected to each other, and the drain electrode and the light emitting layer are electrically connected to each other.

6. The display panel according to claim 1, wherein the source electrode and the light emitting layer are electrically connected to each other, and the drain electrode and the light emitting layer are electrically connected to each other.

7. The display panel according to claim 5, further comprising a connection electrode, wherein the light emitting layer and the drain electrode are electrically connected to each other via the connection electrode.

8. The display panel according to claim 7, wherein an orthographic projection of the connection electrode on the active layer partially overlaps with an orthographic projection of the light emitting layer on the active layer.

9. The display panel according to claim 8, wherein at least one of the drain electrode or the connection electrode is a transparent electrode.

10. The display panel according to claim 1, wherein the active layer is a p-type active layer, and a highest occupied molecular orbital of the energy level transition layer is in an energy level match with a work function of the p-type active layer.

11. The display panel according to claim 1, wherein the active layer is an n-type active layer, and a lowest unoccupied molecular orbital of the energy level transition layer is in an energy level match with a work function of the n-type active layer.

12. The display panel according to claim 1, wherein the gate electrode, the active layer, the gate insulating layer, the light emitting layer, the source electrode and the drain electrode constitute an luminous field effect transistor, the display panel comprises a plurality of the luminous field effect transistors, the plurality of luminous field effect transistors are arranged in such a way that source electrodes of two adjacent luminous field effect transistors in a first direction are integrated to form a first combined body and drain electrodes of two adjacent luminous field effect transistors in the first direction are integrated to form a second combined body, wherein the first combined body and the second combined body are alternately arranged in the first direction.

13. The display panel according to claim 12, wherein the plurality of luminous field effect transistors are arranged in such a way that source electrodes of two adjacent luminous field effect transistors in a second direction perpendicular to the first direction are integrated to form the first combined body and drain electrodes of two adjacent luminous field effect transistors in the second direction are integrated to form the second combined body, wherein the first combined body is connected to a power line, and the second combined body is connected to a ground line.

14. The display panel according to claim 12, further comprising a switching thin film transistor, a source electrode of the switching thin film transistor being connected to a data line, a gate electrode of the switching thin film transistor being connected to a gate line, and a drain electrode of the switching thin film transistor being electrically connected to the gate electrode of the luminous field effect transistor.

15. The display panel according to claim 6, further comprising a connection electrode, wherein the light emitting layer and the drain electrode are electrically connected to each other via the connection electrode.

16. The display panel according to claim 15, wherein an orthographic projection of the connection electrode on the active layer partially overlaps with an orthographic projection of the light emitting layer on the active layer.

17. The display panel according to claim 16, wherein the drain electrode does not cover the light emitting layer.

18. The display panel according to claim 1, wherein orthographic projections of the source electrode and the drain electrode on the active layer each have a tooth shape, comprising a plurality of protruding extensions and recesses between the extensions, at least one extension of the source electrode extends into one recess of the drain electrode, and at least one extension of the drain electrode extends into one recess of the source electrode.

19. The display panel according to claim 1, wherein orthographic projections of the source electrode and the drain electrode on the active layer each form a shape of a capital letter "F".

20. The display panel according to claim 1, wherein orthographic projections of the source electrode and the drain electrode on the active layer are two concentric enclosed rings spaced apart from each other.

* * * * *